United States Patent [19]
Claussen

[11] 4,439,729
[45] Mar. 27, 1984

[54] EVALUATION CIRCUIT FOR A DIGITAL TACHOMETER

[75] Inventor: Ulf Claussen, Wedel, Fed. Rep. of Germany

[73] Assignee: Siemens Aktiengesellschaft, Berlin and Munich, Fed. Rep. of Germany

[21] Appl. No.: 361,556

[22] Filed: Mar. 24, 1982

[30] Foreign Application Priority Data

Apr. 8, 1981 [DE] Fed. Rep. of Germany ....... 3114221

[51] Int. Cl.³ .................. H03K 5/26; G01P 13/04
[52] U.S. Cl. .................... 324/165; 324/166; 328/133
[58] Field of Search ............... 324/79 R, 168, 165, 324/166, 160; 328/133, 134; 307/514, 525, 510, 511

[56] References Cited

U.S. PATENT DOCUMENTS 4,403,193 9/1983 Takemura .................... 328/133 X

FOREIGN PATENT DOCUMENTS 809483 2/1981 U.S.S.R. ........................... 328/133

OTHER PUBLICATIONS

Jackson: "Logical Motion and Direction Detection", IBM Tech. Discl. Bulletin–May 1972, pp. 3672–3673.

Primary Examiner—Ernest F. Karlsen
Assistant Examiner—Jose M. Solis
Attorney, Agent, or Firm—Kenyon & Kenyon

[57] ABSTRACT

An evaluation circuit for receiving the output signals from a tachometer, the output signal consisting of first and second speed-proportional pulse trains which are phase-shifted with respect to one another in response to the direction of rotation. The evaluation circuit converts the phase-shifted pulse trains into a speed-proportional pulse train having a frequency which is four times that of the first and second pulse trains, and into a separate sign signal indicative of the direction of rotation. The first and second pulse trains are conducted to respective first and second signal memories which are controlled by a clock signal. In one embodiment, four possible states for the combined first and second pulse trains are assigned respective designating numbers. The count in a bidirectional counter is caused to follow changes in the designating numbers, the bidirectional counter counting pulses from the clock signal until such coincidence is achieved. The pulses so counted represent the desired speed-proportional pulse train. The present evaluation circuit operates to produce correct speed-proportional and direction-indicating signals even where the pulses of the first and second pulse trains are in phase with one another.

3 Claims, 3 Drawing Figures

4,439,729

EVALUATION CIRCUIT FOR A DIGITAL TACHOMETER

BACKGROUND OF THE INVENTION

This invention relates generally to digital circuits, and more particularly, to a digital circuit for converting first and second speed-proportional pulse trains which are phase-shifted with respect to one another, into a speed-proportional pulse train having a frequency which is four times that of the first and second pulse trains, and a sign signal indicative of the direction of rotation.

Commercially available tachometers are generally arranged to deliver two pulse signal channels, each having a frequency which is proportional to the speed of rotation. Ideally, the pulse trains are phase-shifted by 90°; the pulse trains either leading or lagging one another depending upon the direction of rotation. It is desirable to base the speed measurement on a frequency which is as high as possible, thereby enabling the evaluation to be made by means of a smoothing capacitor which has a relatively small capacity compared to a capacitor which would be required at a lower frequency. In this manner, the smaller capacitor can achieve a ripple characteristic similar to that of the larger capacitor operating at a lower frequency, while enabling the time constant to remain small. In addition, the higher signal frequency permits the indication of the digital evaluation to follow more quickly the actual speed value. In commercially available evaluation circuits, a high evaluation frequency is obtained by releasing in both channels an evaluation pulse for every positive-going and negative-going flank, thereby producing a pulse train with four times the frequency of the pulse train in the two pulse channels. The direction of rotation is ascertained by determining whether the phase shift is positive or negative.

High resolution is obtained for low speeds by using transmitters having a high number of pulses per revolution. When using such transmitters, the output signals for high speeds are of correspondingly high frequency, illustratively on the order of approximately 120 kHz. Such high frequency operation emphasizes the effects of unavoidable asymmetries in the pickup and different propagation times in the electronic processing. Thus, at high frequencies, it is not assured whether the pulses of the two pulse channels have a 90° phase relationship. In addition, since changes in the logical states in both channels occur very quickly, and the logic circuitry may be of the C-MOS type having a maximum processing speed of approximately 1 MHz, there is a danger that the logic state changes may not processed at such high frequencies. Faulty evaluation results if the time between two changes in both pulse channels becomes shorter than the length of the evaluation pulses of the evaluation circuit which are released with every pulse flank. The permissible frequency of the pulse trains delivered by the tachometer is therefore limited by the width of the evaluation pulses, and therefore the consequence of all worst-case tolerances must be considered.

In addition to the foregoing, difficulties are encountered if the pulse train generated by the evaluation circuit is processed in a clock-controlled circuit, such as in a computer, because the pulse train cannot be synchronized with the clock frequency.

It is, therefore, an object of this invention to provide an evaluation circuit of the type wherein the speed-proportional pulse train is synchronized with a clock pulse raster so that the circuit operates without a frequency limit.

SUMMARY OF THE INVENTION

The foregoing and other objects are achieved by this invention which provide an evaluation circuit for a digital tachometer which converts the first and second pulse trains which are proportional to the speed of rotation and are phase-shifted in response to the direction of rotation, into a speed proportional pulse train having four-times the frequency of the first and second pulse train, and a sign signal. The inventive evaluation circuit is further provided with a clock generator which delivers a clock signal at a frequency which is at least four times the maximum frequency of the first and second pulse trains. The first and second pulse trains are conducted to respective ones of first and second signal memories which are controlled by the clock generator. The signal combinations produced by the outputs of the first and second signal memories are assigned respective numbers in the order of their appearance. A controllable switch interconnects the clock generator to an input of a bidirectional counter which counts the negative flanks.

A comparator, which is connected at its inputs to the outputs of the bidirectional counter and the first and second signal memories, produces at its outputs signals indicative of a +1 or −1 deviation from the number of the signal combination of the output signals of the first and second signal memories, the outputs being connected to the set and reset inputs, respectively, of a sign memory. The comparator is provided with a further output which indicates coincidence of the count of the bidirectional counter and the signal combination of the output signals of the first and second signal memories. This further output is connected to a control input of the controllable electronic switch, and causes the electronic switch to open if a "1" logic signal is present thereon. The output of the sign memory is coupled to a control input of the bidirectional counter for selecting either the forward or backward counting mode. Thus, the output of the sign memory is the sign signal indicative of the direction of rotation, and the speed-proportional pulse train is available at the output of the controllable electronic switch.

In the present inventive evaluation circuit, a pulse train is delivered which is synchronized with the clock signal of the clock generator. The spacings of the pulses either within or between the first and second pulse trains can become arbitrarily short.

In a further embodiment of the invention, a reduction in the cost of the circuitry can be achieved by utilizing an ordinary binary counter as the bidirectional counter. A simple Exclusive-OR gate can be used as the code converter.

BRIEF DESCRIPTION OF THE DRAWINGS

Comprehension of the invention is facilitated by reading the following detailed description in conjunction with the annexed drawings, in which.

DETAILED DESCRIPTION

Figure 1:
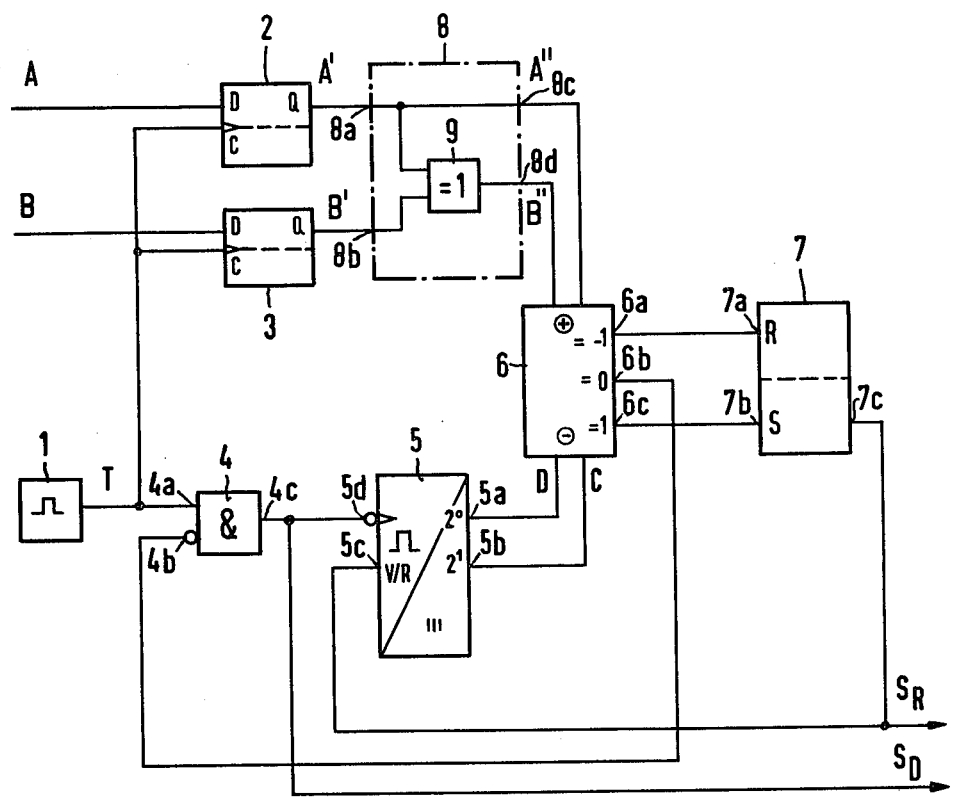
FIG. 1 is a block diagram of an embodiment of the invention.

FIG. 1 shows a block diagram of an evaluation circuit constructed in accordance with the principles of the invention. The pulse signal trains of a tachometer (not shown) are received by the evaluation circuit at pulse channels A and B, respectively, and are each conducted to the D input of a respective one of signal memories 2 and 3. Signal memories 2 and 3 are controlled by the positive-going pulse flanks of clock signals which are received at their input C from a clock generator 1. Signal memories 2 and 3 each produces at its Q output a respective one of output signals A' and B'. Output signals A' and B' are coupled to respective input terminals 8a and 8b of a code converter 8. Code converter 8 is comprised of Exclusive-OR gate 9, the inputs of which are connected to input terminals 8a and 8b. Exclusive-OR gate 9 is coupled at its output to an output terminal 8d of code converter 8. In addition, input terminal 8a is directly coupled to output terminal 8c.

A clock pulse signal T at the output of clock generator 1 is coupled to an input 4a of an AND gate 4 which performs as an electronic switch. Output terminal 4c of AND gate 4 is coupled to an input 5d of a bidirectional counter 5. Bidirectional counter 5 counts the negative flanks of the clock pulses. A control terminal 5c of bidirectional counter 5 is connected to an output terminal 7c of a sign memory 7, for determining whether bidirectional counter 5 counts forward or backward. Output terminals 8c and 8d of code converter 8, and output terminals 5a and 5b of bidirectional counter 5 are connected to a comparator 6 for comparison. Comparator 6 may be, for example, a simple subtraction circuit which subtracts the binary signals present at the outputs 5a and 5b from the binary signals present at the outputs 8c and 8d. A "1" logic signal is present at output terminal 6a if the result of the subtraction is a $-1$, and a "1" logic signal is present at output terminal 6b if the result of the subtraction is zero. A logical "1" signal is present at output 6c if the result of the subtraction is $+1$. The similarly possible results of $+2$ and $-2$ are not evaluated.

Output terminal 6a is connected to resetting input terminal 7a of sign memory 7, and output terminal 6c is coupled to the setting input terminal 7b. Output 6b of comparator stage 6 is coupled to inverting input terminal 4b of AND gate 4. Output terminal 7c of sign memory 7 is connected to the forward-backward control input terminal 5c of bidirectional counter 5. In this embodiment, bidirectional counter 5 counts in a forward direction if a "1" logic signal is present at output terminal 7c.

A signal $S_R$ which is indicative of the direction of rotation is present at output terminal 7c of sign memory 7. A speed-proportional output pulse sequence $S_D$ is available at output terminal 4c of AND gate 4, and at input terminal 5d of bidirectional counter 5.

Figure 2:
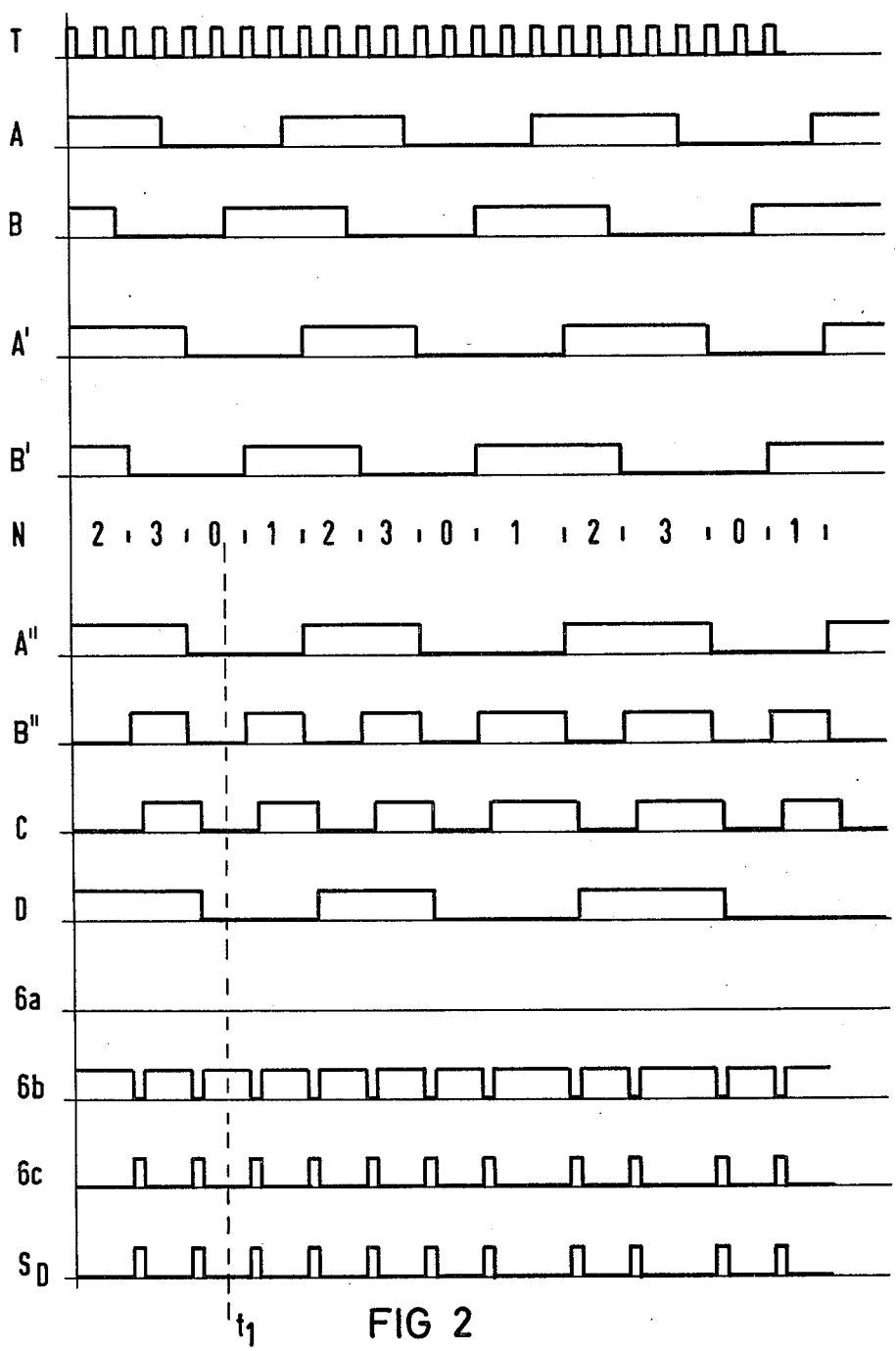
FIGS. 2 and 3 are pulse timing diagrams which are useful for explaining the operation of the embodiment of FIG. 1.

FIG. 2 shows a timing diagram which is useful for explaining the operation of the circuit arrangement of FIG. 1. In FIG. 2, pulse trains A and B are shown to be undistorted, the pulses of pulse train B leading those of pulse train A by 90°. A positive direction of rotation is assumed. Pulse trains A and B are conducted to signal memories 2 and 3, respectively, which are controlled by clock signal T. Thus, each signal memory changes its storage state with the positive clock flank following a change of the pulses A and B. The output pulse signals of signal memories 2 and 3 are identified in FIG. 2 by A' and B', respectively. Signals A' and B' have only four possible combinations which are identified with the numbers 0, 1, 2 and 3, in FIG. 2, in the order of their appearance. The possible combinations are tabulated as follows:

0: A'=0; B'=0
1: A'=0; B'=1
2: A'=1; B'=1
3: A'=1; B'=0

These combinations occur, for the positive direction of rotation, always in the same order, 0, 1, 2, 3, 0, ..., and for the negative direction of rotation in the reverse order, 3, 2, 1, 0, 3, .... The particular combinations of pulse trains A' and B' are identified by code converter 8, in the order of their appearance for the positive direction of rotation by increasing binary numbers, which binary numbers correspond to the above-mentioned decimal numbers. The binary signals which comprise the binary number are produced at output terminals 8c and 8d of code converter 8, these signals being identified as A" and B", B" being the less significant bit. Thus, in order to produce binary numbers corresponding to the 0, 1, 2, or 3 states (in decimal form), pulse trains A" and B" must assume the corresponding binary states indicated in the table above.

As shown in FIG. 2, pulse train A" is identical to pulse train A', thereby permitting input terminal 8a to be connected directly to the corresponding output terminal 8c. Pulse train B", however, is obtained from the Exclusive-OR gate 9, and therefore is not identical to pulse train B'. The above-identified combination of binary signals A" and B" produce information indicative of the position of the tachometer.

In correspondence with the binary information resulting from the combination of binary signals A" and B", counter 5 is made to follow the actual present speed value. A pair of binary signals, C and D, which correspond to a binary number, is present at outputs 5a and 5b of bidirectional counter 5. The binary number D, C is subtracted from the binary number A", B", and the result of the subtraction is evaluated for controlling bidirectional counter 5.

It is first assumed that binary number A", B", as well as the binary number C, D, are zero; tnis particular instant being shown at the broken line in FIG. 2. Thus, the subtraction of the comparator 6 results in a zero value, and thereby a logical "1" signal is present at output 6b of comparator 6. This logical "1" signal keeps output 4c of AND gate 4 at a logical "0" state, and thus the clock pulse flanks of clock generator 1 are not passed through to counting input 5d of bidirectional counter 5. The count of counter 5 therefore remains unchanged.

If now signal B" changes to a logical "1" state, such that binary number A", B" changes to a decimal value "1", comparator 6 determines a deviation $+1$. This, output terminal 6c produces a logical "1" signal state, as shown in FIG. 2. This state change further signifies that the direction of rotation is positive because it can be concluded from the deviation "positive sign 1" that the number sequence is traversing in the positive direction of 0, 1, 2, 3, etc. Thus, since output terminal 6c is coupled directly to the set terminal 7b of the sign memory, sign memory 7 is set to the setting side, so that a logical "1" state is present at output terminal 7c of the sign memory. The signal at output terminal 7c is the direction of rotation signal $S_R$. Moreover, this signal is conducted to the forward-backward control input terminal 5c of bidirectional counter 5 so as to switch the bidirectional counter into the forward counting mode.

Simultaneously with the appearance of the logical "1" signal state at output terminal 6c, the signal at output terminal 6b changes from a logical "1" state to a logical "0" state. Thus, clock pulses are now released via AND gate 4. Upon the immediately following negative pulse flank of clock pulse T, counter 5 is incremented by 1, such that output C achieves a logical "1" state. Thus, the difference between binary numbers A", B" and C, D becomes zero again, and the clock pulse is blocked again by the AND gate 4 until a deviation between the binary numbers occurs again. The content of counter 5 is thereby shifted maximally by one clock pulse so as to follow binary number A", B", which corresponds to the position of the tachometer. Output signal $S_D$ shown in FIG. 2, is present at output terminal 4c of AND gate 4 and contains, in accordance with the four signal states of signal combination A', B', four pulses per period of the signal A or B. Thus, signal $S_D$ is the desired speed-proportional pulse train having a frequency which is four times that of signals A and B. The slight time shift relative to the original pulse trains A, B, is maximally one period of clock signal T. Since the clock signal is of a relatively high frequency, illustratively in the range of 1 MHz, this slight signal delay is generally in the order of one microsecond and is negligible.

If the direction of rotation is reversed, the signal combination of A' and B' is traversed in the opposite direction. The corresponding characteristic numbers therefore run in the negative direction of 3, 2, 1, 0, 3, . . . . Thus, comparator 6 determines for each flank of signals A', B' a negative deviation of the number of A", B" from the number C, D, if there was no previously deviation. Signal memory 7 would therefore be set to the resetting side. Signal $S_R$ would go to zero so that the negative direction of rotation is indicated. In addition, counter 5 is switched to backward counting operation so that it counts in the backward direction as 3, 2, 1, 0, 3, . . . . In this manner, counter 5 is made to follow the tachometer position characterized by binary number A", B", in the negative direction, and signal $S_D$ represents a speed-proportional pulse train with four-times the frequency of pulse trains A, B.

Figure 3:
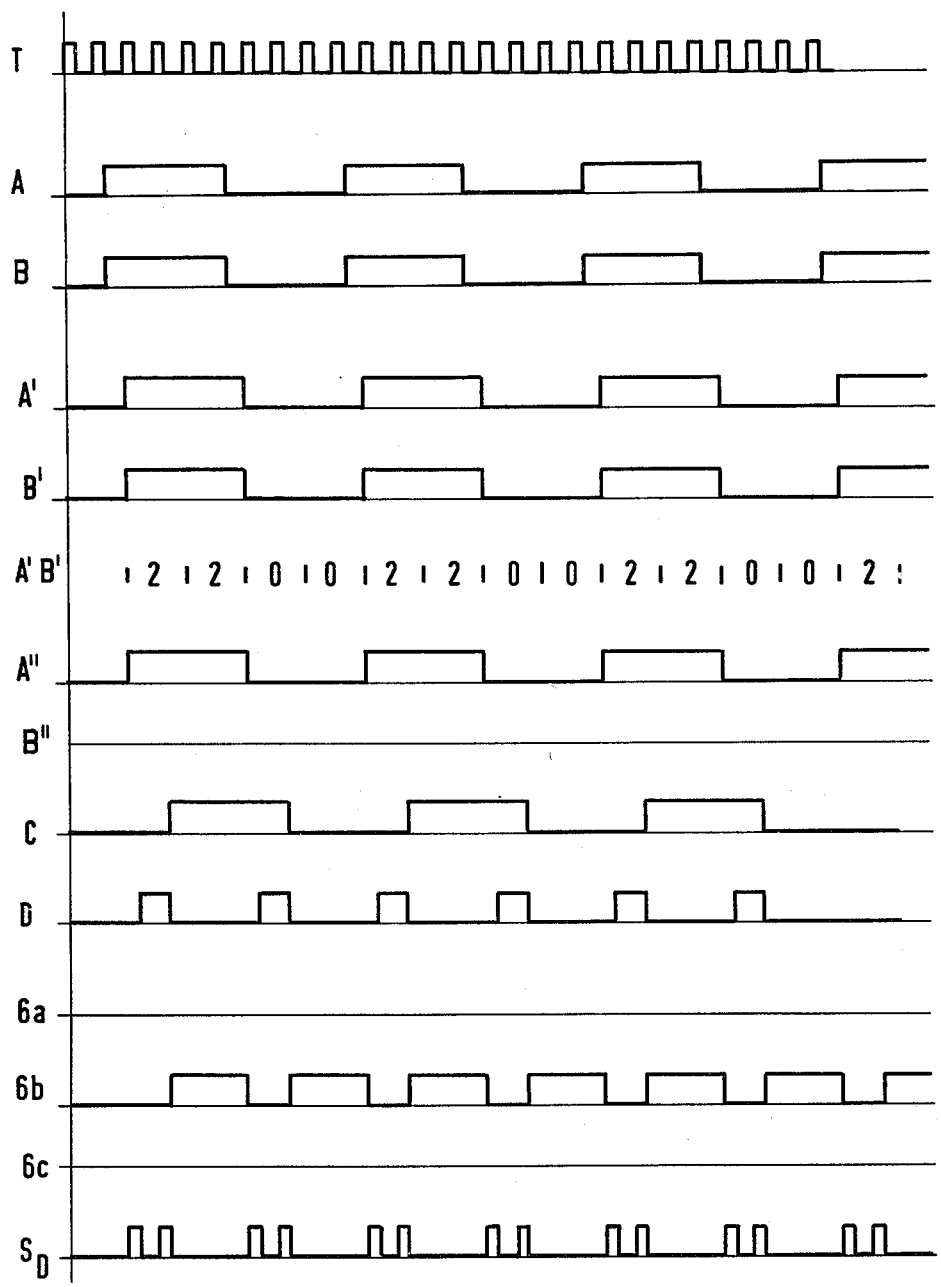

The foregoing discussion and FIG. 2 describe the operation of the evaluation circuit for symmetrical pulse trains A and B, for the ideal phase shift of 90° between pulse trains A and B. FIG. 3, however, illustrates the timing pulses for the evaluation circuit wherein the phase shift between pulse train A and pulse train B becomes very small, or even zero. Such small pulse spacings occur, for example, at high speeds due to asymmetries in the pickup and different propagation times in the evaluation circuit.

FIG. 3 shows an extreme case wherein there is no spacing between the pulses of pulse trains A and B. The pulses of pulse trains A and B are transferred by clock pulses T into signal memories 2 and 3. Pulse trains A' and B' are therefore identical, and therefore only the pulse state identified by the numbers 0 and 2 still occur. Thus, after the binary recoding of code converter 8, signal B" remains at zero, while signal A" is again identical with signal A'. Examination of signal combination A', B' shows that it contains no information regarding the direction of rotation since the signal sequence 0, 2, 0, 2, . . . occurs for forward as well as reverse operation. However, a signal for the direction of rotation is still stored in sign memory 7. In practical operation, it can be assumed that the direction of rotation does not change suddenly but that in the event of a reversal of the direction of rotation, low speed ranges are always temporarily reversed until a high speed in the other direction can be built up. At low speeds, however, the occurring pulse distortions are smaller, so that the sign can be evaluated correctly again when passing through low speeds. It can therefore be assumed that memory 7 always contains the correct sign.

Examination of the pulse combination A', B' shows that while it contains only two of the four possible combinations, information regarding the missing signal combinations is available because a 1 state must be located between the numbers 0 and 2, and a 3 state between 2 and 0. As will be described this is evaluated in the evaluation circuit for reconstructing the correct pulse train.

It is first assumed that the number A", B", as well as the number C, D, are both zero so that comparator circuit 6b has a logical "1" state present which blocks clock pulses via AND gate 4. If now the number A", B" jumps to 2, the deviation from the number C, D is +2 and the logical "1" signal at output terminal 6d disappears, so that the clock pulses are passed again. Counter 5 now also reaches the number 2 after two clock pulses, so that comparator output terminal 6b again goes to logic state "1" and blocks the clock pulses. If the number A", B" jumps to zero again, two clock pulses are released which bring the counter 5 likewise to the count 0. The count of counter 5 thus follows, with a certain amount of delay, the number A", B" which characterizes the tachometer position.

In addition, the extreme case shown in FIG. 3 generates a speed-proportional pulse train with four-times the frequency of pulse train A or B. The situation where two pulse flanks of the pulse trains A and B can no longer be distinguished in time from one another can occur always if they are within a clock period of the clock signal T. This results from the fact events occurring within a clock period are evaluated as simultaneously. As noted, however, this situation has no adverse effect upon the exact evaluation of the pulse trains.

In contrast to the improved inventive evaluation circuit described herein, the known evaluation circuit mentioned at the outset, which releases a short pulse with each pulse flank of the pulse trains A and B, would suddenly furnish only two times the frequency, and thereby produce completely false measurement results.

For negative speeds, the operation of the circuit in accordance with FIG. 3 is analogous to operation in the positive direction of rotation.

In the inventive circuit arrangement, there is no limit, in principle, for the spacings between the individual pulses of pulse trains A and B, except that a pulse shift beyond 90° may lead to a false evaluation of the direction of rotation. This, however, must be prevented by an appropriate design of the tachometer itself. The present inventive circuit is suitable for use with a computer because the speed-proportional pulse train consists of gated-out clock pulses which are synchronized with a clock pulse, which may be provided by the computer. Thus, the advantages of computer evaluation are available with the present invention.

Although the invention has been described within the context of a specific embodiment for specific applications, it is to be understood that persons skilled in the art can generate additional embodiments, in light of this teaching, without departing from the spirit or exceeding the scope of the claimed invention. The drawings and descriptions in the present disclosure are proffered to facilitate comprehension of the invention, and not construed to limit the scope thereof.

What is claimed is:

1. A evaluation circuit for a digital tachometer, the digital tachometer being of the type which produces first and second pulse trains having a frequency proportional to the speed of rotation, the pulse trains being phase-shifted in response to the direction of rotation, the evaluation circuit being of the type which converts the first and second pulse trains into a speed-proportional pulse train having four times the frequency of the first and second pulse train, and into a separate sign signal, the evaluation circuit further comprising:

clock terminal means for receiving a clock signal having at least four times the maximum frequency of the first and second pulse trains;

first and second signal memory means for receiving the first and second pulse trains, respectively, said first and second signal memory means being controlled by said clock signal, and producing at respective output terminals first and second memory means output signals, said memory means output signals, in combination, forming sequential binary numbers corresponding to predetermined combinations of the first and second pulse trains;

controllable switch means having a first input terminal connected to said clock terminal means for receiving said clock signal, a second input terminal for receiving a controllable switch means enabling signal, and an output terminal for producing said clock signal in response to said controllable switch means enabling signal;

bidirectional counter means having a first input terminal connected to said output terminal of said controllable switch means, for counting the negative flanks of said clock signal;

comparator means having a plurality of input terminals connected to respective output terminals of said first and second signal memory means and said bidirectional counter means, said comparator means further having a plurality of output terminals, each output terminal producing a respective output signal indicative of a predetermined deviation from a prior sequential binary number formed from said memory means output signals, first and second ones of said plurality of output terminals corresponding to deviations of "+1" and "−1", respectively, said comparator means further having a third output terminal for producing a signal indicative of coincidence of a binary number at said output terminals of said bidirectional counter means and said sequential binary numbers formed of said memory means output signals, said third output terminal being connected to said second input terminal of said controllable switch means for producing said controllable switch means enabling signal; and sign means having first and second input terminals connected to said first and second output terminals, respectively, of said comparator means, and an output terminal for producing a signal indicative of the direction of rotation of the tachometer.

2. The evaluation circuit of claim 1 wherein said bidirectional counter means is a binary counter and there is further provided code converter means electrically interconnected intermediate of said output terminals of said first and second signal memory means and said comparator means, said code converter means being arranged to convert said sequential binary numbers formed of said memory means output signals into successive binary numbers corresponding to said predetermined combinations of the first and second pulse trains.

3. The evaluation circuit of claim 2 wherein said code converter means is provided with first and second input terminals connected to respectively associated ones of the output terminals of said signal memory means, said code converter means further having first and second output terminals, said first input and first output terminals of said code converter means being directly coupled to one another, said code converter means further having Exclusive-OR gate means having first and second input terminals connected to said first and second input terminals, respectively, of said code converter means, and an output terminal connected to said second output terminal of said code converter means.

* * * * *